United States Patent [19]

Saeki et al.

[11] Patent Number: 4,954,991
[45] Date of Patent: Sep. 4, 1990

[54] SEMICONDUCTOR MEMORY WITH P-CHANNEL LOAD TRANSISTOR

[75] Inventors: Yukihiro Saeki; Toshimasa Nakamura, both of Yokohama, Japan

[73] Assignee: Kabushiki Kaisha Toshiba, Kawasaki, Japan

[21] Appl. No.: 447,391

[22] Filed: Dec. 7, 1989

Related U.S. Application Data

[63] Continuation of Ser. No. 94,706, Sep. 9, 1987.

[30] Foreign Application Priority Data

Sep. 30, 1986 [JP] Japan .................. 61-231721
Sep. 30, 1986 [JP] Japan .................. 61-231803

[51] Int. Cl.⁵ ............. G11C 7/00; G11C 11/409; G11C 16/06
[52] U.S. Cl. ............ 365/189.01; 365/185; 365/190; 365/104; 365/181; 307/571
[58] Field of Search ........... 365/189.01, 190, 185, 365/189.05, 189.08, 104, 181; 307/571, 579

[56] References Cited

U.S. PATENT DOCUMENTS

| | | | |
|---|---|---|---|
| 4,656,607 | 4/1987 | Hagiwara et al. | 365/182 |
| 4,663,740 | 5/1987 | Ebel | 365/185 |
| 4,665,507 | 5/1987 | Gondou et al. | 365/190 |
| 4,710,900 | 12/1987 | Higuchi | 365/189 |
| 4,737,936 | 4/1988 | Takeuchi | 365/230 |

OTHER PUBLICATIONS

*Microelectronics Digital and Analog Circuits and Systems,* 1979, McGraw Hill by Jacob Millman, Ph.D., pp. 48, 49.

Frohman-Bentchkowsky, "A Fully Decoded 2048-Bit Electrically Programmable FAMOS Read-Only Memory," IEEE Journal of Solid State Circuits, vol. SC-6, No. 5, pp. 301–306, Oct. 1971.

*Primary Examiner*—Stuart N. Hecker
*Assistant Examiner*—Alyssa H. Bowler
*Attorney, Agent, or Firm*—Finnegan, Henderson, Farabow, Garrett and Dunner

[57] ABSTRACT

A p-channel MOS transistor is connected in series to a floating gate n-channel MOS transistor forming a memory cell, so that the p-channel MOS transistor functions as the load of the memory cell. The operational characteristic of the p-channel MOS transistor determines the data-writing current of the memory cell. Hence, hardly any change occurs in the data-writing current, even if the operation characteristic of the memory cell changes. A semiconductor memory includes memory cells constituted by floating gate n-channel MOS transistors. The memory further includes a data-reading, column-selecting circuit comprising n-channel MOS transistors, and a data-writing, column-selecting circuit comprising p-channel MOS transistors. By way of the above structure, the data-writing voltage can be prevented from being lowered.

6 Claims, 9 Drawing Sheets

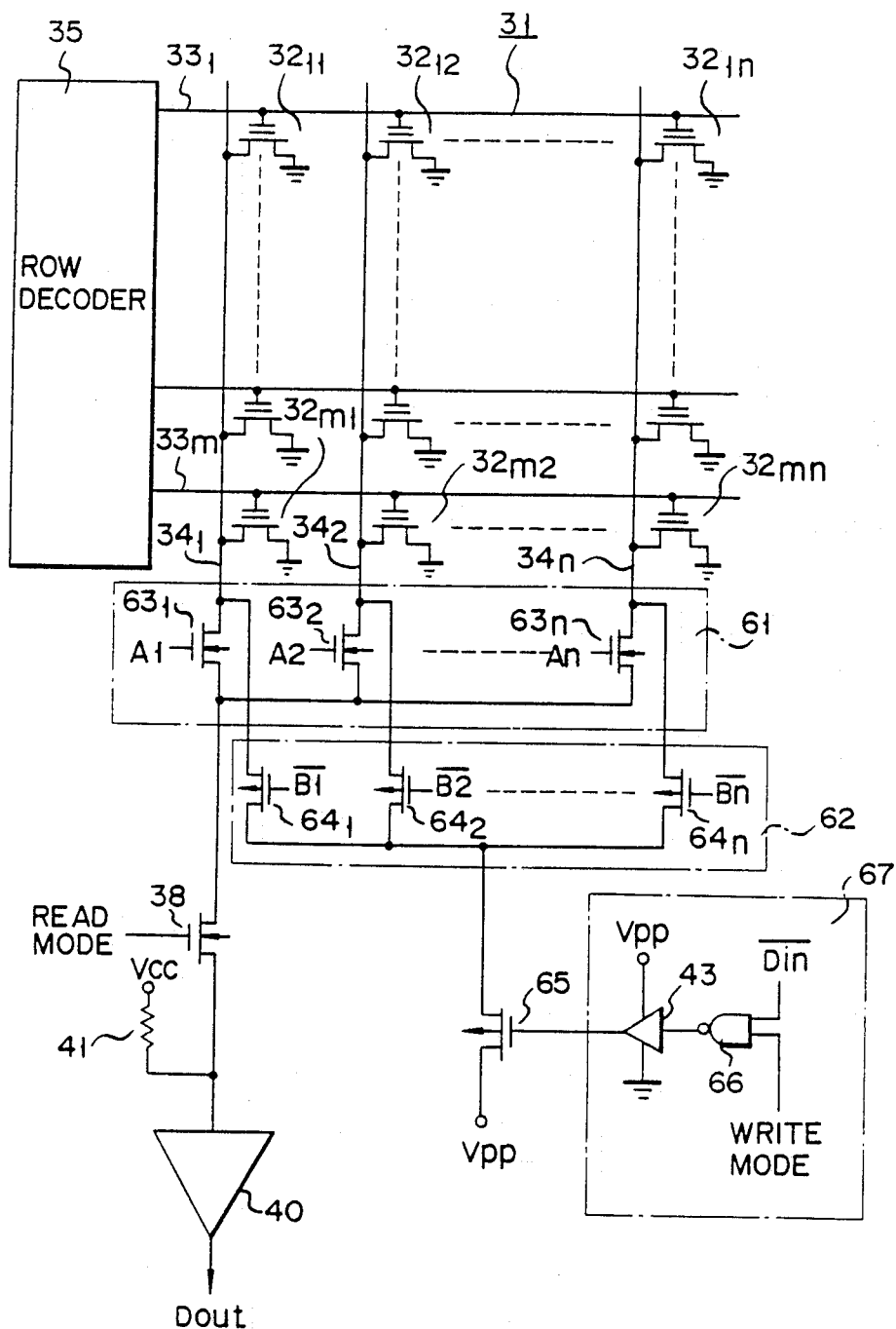
F I G. 9

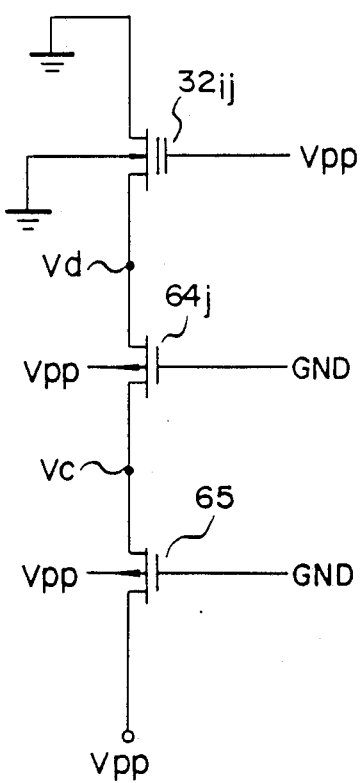
F I G. 10

SEMICONDUCTOR MEMORY WITH P-CHANNEL LOAD TRANSISTOR

This is a continuation of application Ser. No. 071,094,706, filed Sept. 9, 1987.

BACKGROUND OF THE INVENTION

The present invention relates to a semiconductor memory and, more particularly, to a programmable read-only memory (PROM) into which data can be written.

A floating-gate, n-channel MOS transistor used as a memory cell in a programmable read-only memory (PROM) has the structure as shown in FIG. 1. As is illustrated in this figure, source 12 and drain 13, both constituted by N+ diffusion layers, are formed in one major surface region of P-type silicon substrate 11. Insulation film 14 is formed on the major surface of substrate 11. Floating gate 15 is embedded in insulation film 14 and is located above that portion of substrate 11 which is situated between source 12 and drain 13. Floating gate 15 thus floats electrically above substrate 11. Control gate 16 is formed on insulation film 14 and is located above floating gate 15. Source electrode 17 is formed in one of two contact holes cut in insulation film 14, and is thereby electrically connected to source 12. Drain electrode 18 is formed in the other contact hole, and is thereby electrically connected to drain 13.

Now, it will be explained how data "0" is written into the n-channel MOS transistor shown in FIG. 1.

First, P-type silicon substrate 11 and source 12 are set at the ground potential (GND). Then, a voltage of, for example, 12.5 V is applied to control gate 16, and a voltage of, for example, 7.0 V is applied to drain 13. As a result, the potential of floating gate 15 rises to, for instance, 9.0 V, since 12.5 V has been applied to control gate 16. Hence, 9.0 V is applied between floating gate 15 and substrate 11, whereby an inversion layer, that is, N-type layer 19, is formed in that surface region of substrate 11 which separates source 12 and drain 13. The electrons within inversion layer 19 are moved toward drain 13 by the voltage applied to drain 13, and collide with those silicon atoms of substrate 11 which are present near drain 13. A so-called "electron avalanche" occurs near drain 13, thereby generating new electrons. Some of these electrons drift to drain 13, and the rest are injected into floating gate 15.

As more and more electrons accumulate in floating gate 15, the potential of the gate falls. When the potential falls to a specific value, electrons can no longer be injected into gate 15. At this point, the writing of data "0" is completed.

With the large memory capacity PROM comprising a number of memory cells having the structure as shown in FIG. 1, it is generally required that data be written into each memory cell in the shortest time possible; for example, within 1 millisecond, or within 100 microseconds.

FIG. 2 shows a circuit consisting of one memory cell 21 of the type shown in FIG. 1, and a circuit for writing data thereinto. Also provided are n-channel MOS transistors 22 and 23, having their current paths connected in series. MOS transistor 22, which is a data-writing transistor, has its drain connected to high-voltage power supply Vpp for supplying 12.5 V, and its gate receives a write signal. MOS transistor 23 is a column-selecting transistor, and its gate receives a column-address signal of voltage Vpp. A row-address signal of voltage Vpp is applied to the control gate of memory cell 21.

When the voltage of the column-address signal and that of the row-address signal both rise to 12.5 V and the drain voltage of memory cell 21 rises to about 7 V, electrons are injected from the substrate into the floating gate of memory cell 21, and data "0" is thereby written into memory cell 21.

FIG. 3 is a graph illustrating the data-writing characteristic of the semiconductor memory circuit shown in FIG. 2. In this figure, curve I indicates the operation characteristic, i.e., the relationship between the drain current Ids and drain voltage Vds which memory cell 21 exhibits when a voltage of 12.5 V (i.e., voltage Vpp) is applied to its control gate. As curve I reveals, the electron avalanche occurs in memory cell 21, at point T. Curve II represents the way in which the load applied to memory cell 21 changes as current Ids and voltage Vds change. Intersection P of curves I and II denotes the operation point of memory cell 21. Curve II is specific to a load constituted by an n-channel MOS transistor.

Data can be written into memory cell 21 even if current Ids is below point T, provided the data does not have to be written at high speed. In order that data can be written in at a sufficiently high speed, drain current Ids should be at the same level as, or above, point T.

However, the angle defined by curves I and II is small in the region above point T, with the result that, in this region, drain current Ids varies considerably even if the inclination of curve I varies only a little, thus causing the data-writing speed of memory cell 21 to vary considerably. The inclination of curve I depends on the process parameters of cell 21, such as the size of the transistor, the impurity concentration of the substrate, the threshold voltage of the transistor, and the like. Since each of the process parameters varies from one memory cell to another, the memory cells in the PROM therefore cannot have the same curve I, i.e., the same data-writing characteristic. Hence, in the conventional PROM, the data-writing current varies considerably from one memory cell to another, with the result that the data-writing characteristic of each cell is unstable.

Most programmable read-only memories (PROMs) have the structure shown in FIG. 4. As is illustrated in this figure, a PROM has memory-cell matrix 31, which comprises a floating-gate, and n-channel MOS transistors $32_{11}$ to $32_{mn}$ which are used as memory cells. The MOS transistors are arranged in rows and columns. The control gates of the n-channel MOS transistors forming each row are coupled to a row-signal line. More specifically, MOS transistors $32_{11}$ to $32_{1n}$ of the first row have their control gates connected to the first row-signal line $33_1$, MOS transistors $32_{21}$ to $32_{2n}$ of the second row have their control gates coupled to the second row line $33_2$, and so forth. MOS transistors $32_{m1}$ to $32_{mn}$ of the last row have their control gates coupled to the last row-signal line $33_m$. Further, the drains of the MOS transistors forming each column are coupled to a column-signal line. More precisely, MOS transistors $32_{11}$ to $32_{m1}$ of the first column have their drains connected to the first column-signal line $34_1$, MOS transistors $32_{12}$ to $32_{m2}$ of the second column have their drains coupled to the second column-signal line $34_2$, and so forth. MOS transistors $32_{1n}$ to $32_{mn}$ of the last column have their drains connected to the last column-signal line $34_n$. The sources of all n-channel MOS transistors $32_{11}$ to $32_{mn}$ are connected to the ground.

The PROM further comprises row decoder 35 and column-selecting circuit 36. The output of row decoder 35 is coupled to row-signal lines $33_l$ to $33_m$. The column-selecting circuit 36 is connected to column-signal lines $34_l$ to $34_n$. Column-selecting circuit 36 comprises column-selecting n-channel MOS transistors $37_l$ to $37_n$, which are turned on and off by outputs $A_l$ to $A_n$ of a column decoder (not shown). MOS transistors $37_l$ to $37_n$ are connected at one end to column-signal lines $34_l$ to $34_n$, respectively, and at the other end to one another, thus forming a node. Data-reading n-channel MOS transistor 38 and data-writing MOS transistor 39 are each connected at one end to this node. The other end of MOS transistor 38 is connected to the input terminal of sense amplifier circuit 40 and also to resistor 41, which in turn is coupled to power supply potential Vcc. Data-reading MOS transistor 38 is turned on by a read-mode signal. The other end of data-writing MOS transistor 39 is coupled to high-voltage power supply potential Vpp. MOS transistor 39 is turned on by the output of data-writing gate circuit 42. Gate circuit 42 comprises buffer circuit 43 and AND gate 44. Buffer circuit 43 is coupled to power supply potential Vpp, and has an output terminal connected to the gate of data-writing MOS transistor 39. AND gate 44 has an output terminal coupled to the input terminal of buffer circuit 43, and provides a logical sum of a write-mode signal and data $\overline{\text{Din}}$ to be written in the PROM.

The operation of the conventional PROM shown in FIG. 4 will now be described.

Assume that memory cell $32_{ij}$ (i=1 to m, j=1 to n) is selected by outputs of row decoder 35 and the column decoder (not shown). Also assume that the read-mode signal and the write-mode signal are at level "1" and level "0", respectively, and, thus, MOS transistor 38 is on, and MOS transistor 39 is off. In this state, sense amplifier circuit 40 detects the data stored in memory cell $32_{ij}$. This data, Dout, appears at the output terminal of sense amplifier circuit 40.

Data "0" and data "1" can be written into any desired memory cell. When the write-mode signal and the read-mode signal are at level "1" and level "0", respectively, MOS transistor 38 is off. When data $\overline{\text{Din}}$ is "1", the output of AND gate is at level "1". As a result, MOS transistor 39 is on. A high voltage is therefore applied from high-voltage power supply Vpp to column-signal line $34_j$, via MOS transistor 39 and column-selecting MOS transistor $37_j$ (j=1 to n), which has been selected by the column decoder. Hence, data "0" is written into memory cell $32_{ij}$ coupled to row-signal line $33_i$ selected by row decoder 35, and to column-signal line $34_j$ connected to column-selecting MOS transistor $37_j$. On the other hand, when data $\overline{\text{Din}}$ is "0" while the write-mode signal and the read-mode signal remain at level "1" and level "0", respectively, the output of AND gate 44 is at level "0". MOS transistor 39 is therefore off. In this case, no high voltage is applied to memory cell $32_{ij}$ selected by row decoder 35 and the column decoder. Hence, data "1" is written into memory cell $32_{ij}$.

FIG. 5 shows memory cell $32_{ij}$ and the circuit for writing data thereinto. In order to write data "0" into memory cell $32_{ij}$, the gate potentials of data-writing MOS transistor 39, column-selecting MOS transistor $37_j$, and memory cell $32_{ij}$ are set at Vpp level (usually 12.5 V), thereby turning these MOS transistors on. Current Iw flows from high-voltage power source Vpp, coupled to the drain of MOS transistor 39, to the source (i.e., ground GND) of floating-gate MOS transistor $32_{ij}$ used as memory cell $32_{ij}$. The hot carriers (i.e., electrons) induced by current I are injected into the floating gate of memory cell $32_{ij}$, thereby writing data "0" thereinto. In order to write data "1" into memory cell $32_{ij}$, the gate potential of data-writing MOS transistor 39 is set at the GND level. Although the potentials at the control gates of column-selecting MOS transistor $37_j$ and memory cell $32_{ij}$ are both at the Vpp level, MOS transistor 39 is off. Hence, no current flows to memory cell $32_{ij}$ from high-voltage power source Vpp. As a result, no electrons are injected into the floating gate of memory cell $32_{ij}$, and this memory cell stores data "1".

As has been described above, memory cell $32_{ij}$ is an n-channel MOS transistor. Column-selecting MOS transistor $37_j$ and data-writing MOS transistor 39 are also n-channel transistors.

FIG. 6 is a circuit diagram modified from the diagram of FIG. 5, and explains how data "0" is written into memory cell $32_{ij}$. When high voltage Vpp is applied to the gate and also to the drain of transistor 39, this transistor is thus on. In this condition, the source potential Va of MOS transistor 39 has not reached the Vpp level. Source potential Va is given as follows, provided that MOS transistor 39 is of enhancement type:

$$Va \leq Vpp - V_{THN}$$

where $V_{THN}$ is the threshold voltage of MOS transistor 39. Source potential Va is not equal to the substrate voltage (GND), and hence, due to the back-gate bias effect, the apparent threshold voltage of MOS transistor 39 rises, and source potential Va is therefore lower than $Vpp - V_{THN}$. Further, the source potential Vb of column-selecting MOS transistor $37_j$ is approximately equal to source potential Va of MOS transistor 39. It follows that potential Va is applied to the source of memory cell $32_{ij}$. As long as the Vpp level is sufficiently high, source potential Va of MOS transistor 39 is also high, and there is no problem in programming the PROM.

However, the recent trend has been for the power-supply voltage level Vpp to be lowered. This is because an LSI will deteriorate rapidly when a high voltage is applied to the signal lines incorporated therein. In the case of a CMOS-LSI, the high voltage applied to the signal lines causes a latch-up phenomenon to occur.

Even when power-supply voltage level Vpp is lowered, it is necessary, in order to write data into memory cell $32_{ij}$, to supply a current large enough to generate hot carriers between the source and drain of memory cell $32_{ij}$. In order to supply such a large current, source potential Vb of column-selecting MOS transistor $37_j$ must also be raised to as close to the Vpp level as possible. Nevertheless, source potential Vb is inevitably lowered by the threshold voltage $V_{THN}$ of data-writing MOS transistor 39, and hence, when power-supply voltage level Vpp is lowered, the current flowing through the source-drain path of memory cell $32_{ij}$ decreases considerably, thus reducing the speed of writing data "0" into memory cell $32_{ij}$.

As has been described above, in the conventional PROM, the data-writing voltage is lowered by the threshold voltage of the data-writing MOS transistor. The current flowing through the source-drain path of each memory cell therefore decreases. Consequently, the efficiency of writing data "0" into the memory cell is inevitably low.

SUMMARY OF THE INVENTION

Accordingly, it is an object of the present invention to provide a semiconductor memory wherein the data-writing characteristic of each memory cell can be sufficiently stabilized, even if the memory cells have different operation points due to the difference in their process parameters.

Another object of the present invention is to provide a semiconductor memory wherein sufficient current can be supplied to each memory cell, even if the data-writing voltage is relatively low, so as to ensure that data "0" can be written into the cell at a sufficiently high speed.

In order to attain the first object of the present invention, a channel type MOS transistor is connected in series to an opposite channel type MOS transistor forming a memory cell, so that the opposite channel type MOS transistor functions as the load of the memory cell. The operational characteristic of the opposite channel type MOS transistor determines the data-writing current of the memory cell. In other words, the opposite channel type MOS transistor determines the operation point of the memory cell. Hence, hardly any change occurs in the data-writing current, even if the operational characteristic of the memory cell changes.

Further, in order to achieve the second object, a p-channel MOS transistor is used to select the write mode, and two column-selecting circuits are provided, one for the read mode, and the other for the write mode. The column-selecting circuit for the read mode comprises n-channel MOS transistors, whereas the column-selecting circuit for the write mode comprises p-channel MOS transistors. This circuit arrangement prevents the data-writing voltage from being lowered.

A semiconductor memory according to an aspect of the present invention comprises a PROM cell of a first channel type, which is electrically programmable, and a MOS transistor of a second channel type, whose source-drain path is connected in series to the PROM cell, and which determines the operation point of the PROM cell when the memory is set in a data-writing mode.

A semiconductor memory according to another aspect of the present invention comprises a cell matrix made up of a plurality of floating gate MOS transistors arranged in rows and columns, and used as memory cells, a plurality of row lines equal in number to the rows of memory cells, one row line being connected to the gate of each of the memory cells of the corresponding row, a plurality of column lines equal in number to the columns of memory cells, one column line being connected to the drain of each of the memory cells of the corresponding column, a data-writing, column-selecting circuit including a plurality of p-channel MOS transistors connected at one end to the column lines, respectively, and controlled by data-writing, column-decode signals, a data-reading, column-selecting circuit including a plurality of n-channel MOS transistors connected at one end to the column lines, respectively, and controlled by data-reading, column-decode signals, and a data-writing, p-channel MOS transistor connected to the other ends of the p-channel MOS transistors of the data-writing, column-selecting circuit, for applying a high voltage to those memory cells selected and turned on when the semiconductor memory is set in level "0" data-writing mode.

BRIEF DESCRIPTION OF THE DRAWINGS

FIG. 9 is a circuit diagram of a semiconductor memory according to a second embodiment of the present invention;

FIG. 10 is a circuit diagram showing one of the memory cells used in the memory of FIG. 9, and also showing a circuit for writing data into this memory cell;

DETAILED DESCRIPTION OF THE PREFERRED EMBODIMENTS

Embodiments of the present invention will now be described, with reference to the accompanying drawings.

Figure 7:
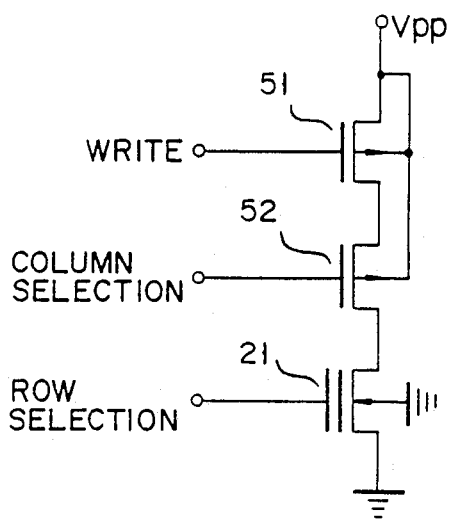
FIG. 7 is a circuit diagram showing a memory cell and a circuit for writing data into the memory cell, according to a first embodiment of the present invention.

FIG. 7 shows a memory cell and the circuit for writing data thereinto.

Figure 1:
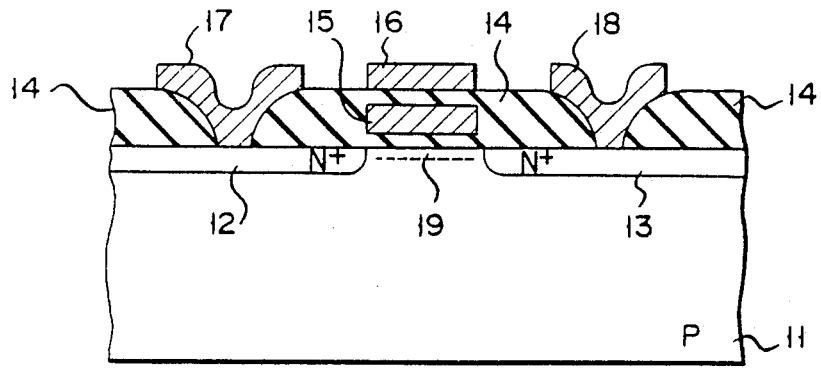
FIG. 1 is a cross-sectional view of a floating-gate, MOS transistor.
Figure 2:
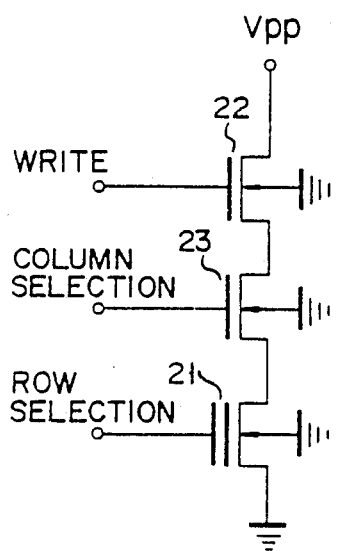
FIG. 2 shows a semiconductor memory using the MOS transistor shown in FIG. 1 as a memory cell, and also shows a circuit for writing data into the MOS transistor.
Figure 3:
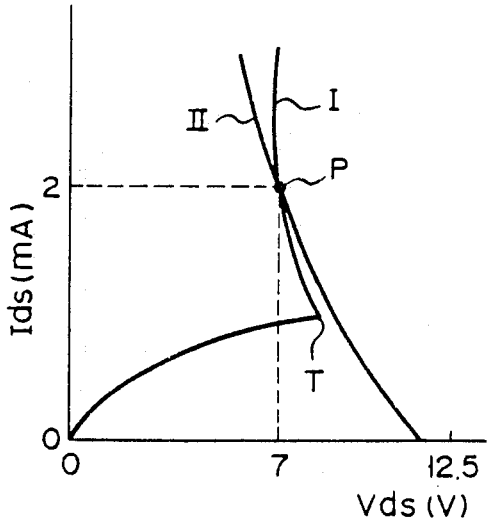
FIG. 3 is a graph illustrating the voltage-current characteristic which the circuit of FIG. 1 exhibits when it is set in the data-writing mode.

As is shown in FIG. 7, memory cell 21 is a floating-gate, n-channel MOS transistor having the structure shown in FIG. 1. The source-drain paths of p-channel MOS transistors 51 and 52 are connected in series to memory cell 21. Transistor 51 is provided for writing data into memory cell 21. High voltage Vpp, or the data-writing voltage, is applied to the source of transistor 51. Voltage Vpp is 12.5 V. A write-mode signal is supplied to the gate of transistor 51. Transistor 52 is provided, in order to select the memory cells of the same column, including memory cell 21. The source of transistor 52 being coupled to the drain of transistor 51, the drain of transistor 52 being coupled to the drain of transistor forming memory cell 21. A column address signal is supplied to the gate of transistor 52. The back gates of both p-channel MOS transistors 51 and 52 are connected to high-voltage power supply Vpp, so that variation in the threshold voltage of transistor 51, resulting from the drop in the substrate bias, can be suppressed. The back gate and source of memory cell 21 are connected to the ground. The row-address signal is supplied to the control gate of memory cell 21.

When the write-mode signal and the column-address signal both change to 0V-level, and the row-address signal changes to 12.5 V level, the drain voltage of memory cell 21 becomes approximately 7 V, whereupon data is written into memory cell 21.

Figure 8:
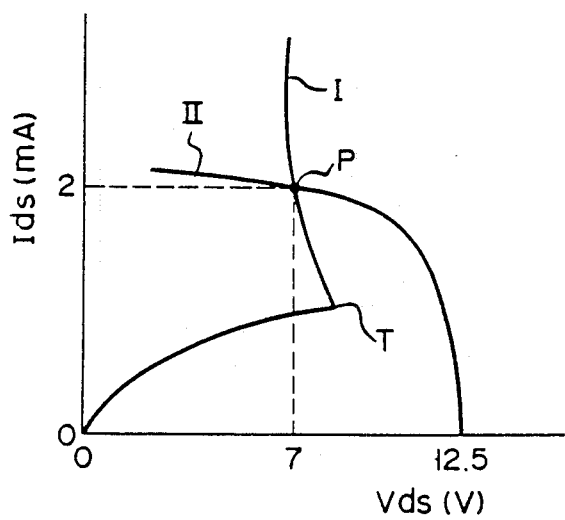
FIG. 8 is a graph illustrating the voltage-current characteristic which the circuit of FIG. 7 exhibits when it is set in the data-writing mode.

FIG. 8 represents the data-writing characteristic of the circuit shown in FIG. 7. More precisely, curve I denotes the Ids-Vds relation which is observed when 12.5 V is applied to the control gate of memory cell, where Ids is the drain current of cell 21, and Vds is the drain voltage of cell 21. The electron avalanche in memory cell 21 starts at point T. The p-channel MOS channel transistors 51 and 52 are both regarded as the load of memory cell 21. This load varies with Ids and Vds, as is illustrated by curve II in FIG. 8. Obviously, curve II is almost horizontal in the range now to be considered. This indicates that when a load circuit for memory cell 21 is formed of two p-channel MOS transistors, 51 and 52, the operational characteristic of the memory circuit can be improved.

Intersection P of curves I and II (FIG. 8) is the operation point of memory cell 21. Drain current Ids, defined by intersection P, is 2 mA, which is sufficient to write data into cell 21 at high speed.

As may be understood from FIG. 8, the currents flowing through transistors 51 and 52 change little in the region above point T, at which the electron avalanche occurs in memory cell 21. This means that the data-writing current scarcely changes even if the operational characteristic of memory cell 21 fluctuates. Therefore, the data-writing speed of cell 21 is not affected by the process parameters of cell 21, thereby enabling a high yield of the PROM to be ensured.

In the circuit of FIG. 7, p-channel MOS transistors 51 and 52 both are used as loads on memory cell 21. However, only one data-writing MOS transistor may be used as a load. If this is the case, it suffices to use a p-channel transistor of a high conductance as column-selecting MOS transistor 52.

When the present invention is applied to a one-bit semiconductor memory, transistor 52 shown in FIG. 7 becomes unnecessary. In this case, transistor 51 functions as a load to memory cell 21.

In the circuit shown in FIG. 7, memory cell 21 is an n-channel MOS transistor, and the load of cell 21 consists of p-channel MOS transistors 51 and 52. Alternatively, cell 21 can be a p-channel MOS transistor, and its load made of n-channel MOS transistors. Also in this case, the same Ids-Vds relation and the same load characteristic as represented by curve I and II shown in FIG. 8 will be obtained.

As has been described above, in the semiconductor memory according to the embodiment, the data-writing characteristic of each memory cell can be sufficiently stable even if the memory cells have different operation points, due to the difference in their process parameters, and data can therefore be written into each cell at high speed.

Figure 4:
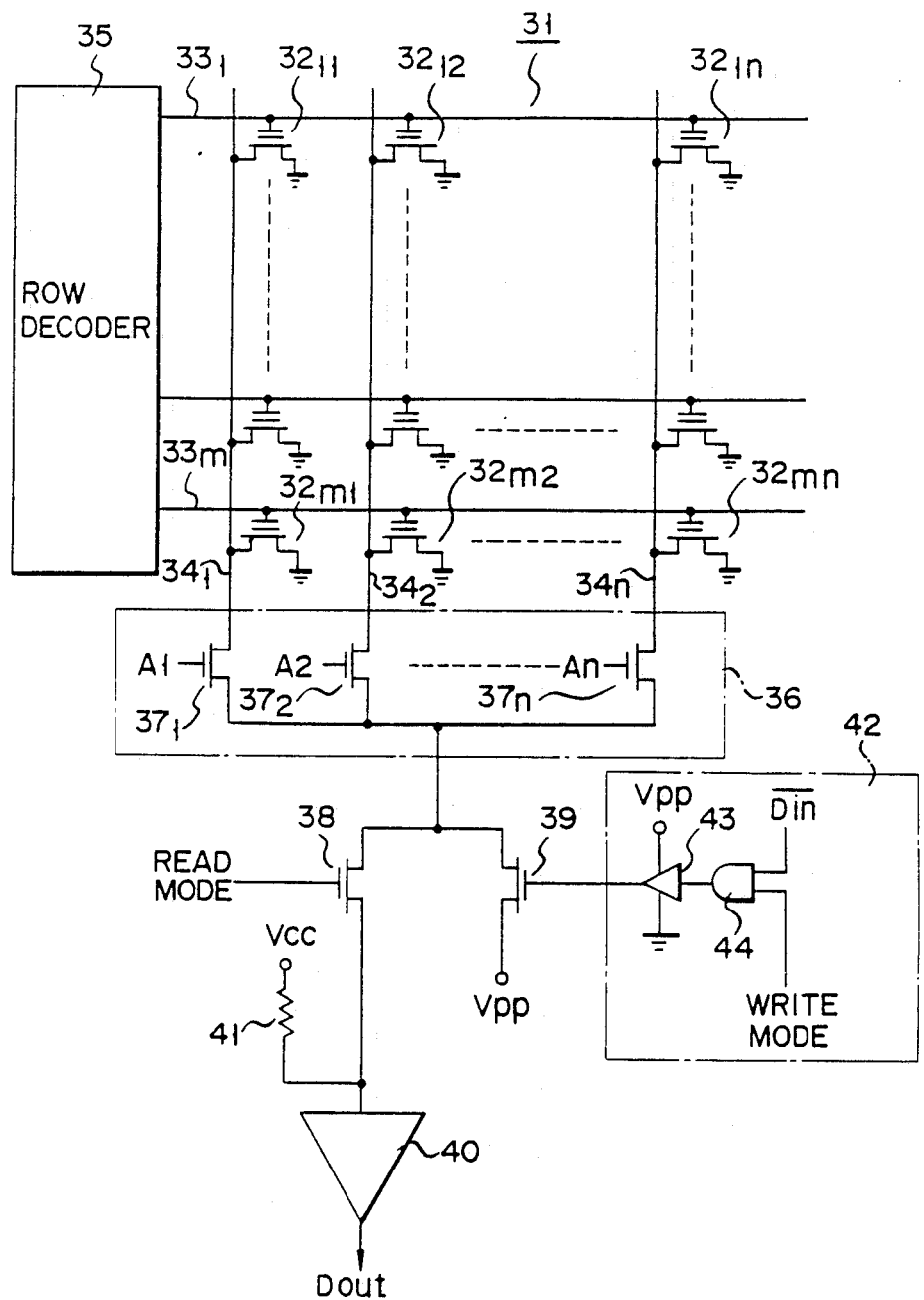
FIG. 4 is a circuit diagram showing a conventional semiconductor memory.
Figure 5:
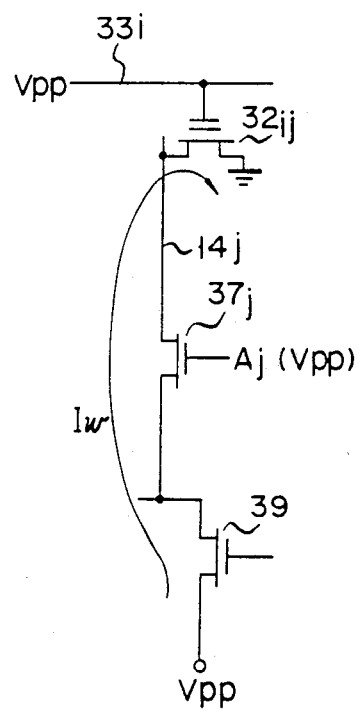
FIG. 5 is a circuit diagram showing one of the memory cells shown in FIG. 4, and a circuit for writing data into this memory cell.
Figure 6:
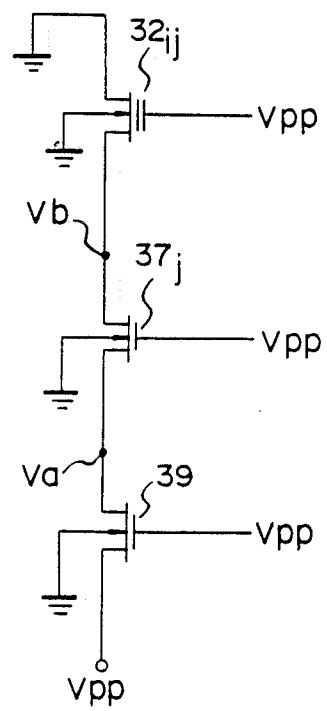
FIG. 6 is a circuit diagram modified from the diagram of FIG. 5.

FIG. 9 shows a PROM according to a second embodiment of the invention. In this figure, the same numerals and symbols are used to designate the same elements as are used in the conventional PROM shown in FIG. 4. As is shown in FIG. 9, this PROM has memory-cell matrix 31. Matrix 31 comprises floating gate, and n-channel MOS transistors $32_{11}$ to $32_{mn}$, used as memory cells and arranged in rows and columns. The control gates of the MOS transistors forming each row are coupled to a row-signal line. More precisely, MOS transistors $32_{11}$ to $32_{1n}$ of the first row have their control gates coupled to the first row-signal line $33_1$, MOS transistors $32_{21}$ to $32_{2n}$ of the second row have their control gates coupled to the second row-signal line $33_2$, and so forth. MOS transistors $32_{m1}$ to $32_{mn}$ of the last row have their control gates connected to the last row-signal line $33_m$. Further, the drains of the MOS transistors forming each column are coupled to a column-signal line. More specifically, MOS transistors $32_{11}$ to $32_{m1}$ of the first column have their drains connected to the first column-signal line $34_1$, MOS transistors $32_{12}$ to $32_{m2}$ of the second column have their drains coupled to the second column-signal line $34_2$, and so forth. MOS transistors $32_{1n}$ to $32_{mn}$ of the last column have their drains connected to the last column-signal line $34_n$. The sources of n-channel MOS transistors $32_{11}$ to $32_{mn}$ are connected to the ground.

The PROM further comprises row decoder 35 and column-selecting circuits 61 and 62. First column-selecting circuit 61 is used to read data from memory-cell matrix 31, and second column-selecting circuit 62 is used to write data in memory-cell matrix 31. First column-selecting circuit 61 comprises column-selecting MOS transistors $63_1$ to $63_n$. MOS transistors $63_1$ to $63_n$ are n-channel transistors and are turned on by output address signals $A_l$ to $A_n$ of a column decoder (not shown) which is used to read data from memory-cell matrix 31. MOS transistors $63_1$ to $63_n$ are connected at one end to column-signal lines $34_1$ to $34_n$, respectively. They are connected at the other end to each other. Second column-selecting circuit 62 comprises column-selecting MOS transistors $64_1$ to $64_n$. MOS transistors $64_1$ to $64_n$ are p-channel transistors and are turned on by output address signals $B_l$ to $B_n$ of another column decoder (not shown), which is provided to write data in memory-cell matrix 31. MOS transistors $64_1$ to $64_n$ are connected at one end to column-signal lines $34_1$ to $34_n$, respectively, and are connected to each other at the other end. The node of the other ends of MOS transistors $63_1$ to $63_n$ is connected to one end of data-reading, n-channel MOS transistor 38. The node of the other ends of MOS transistors $64_1$ to $64_n$ is coupled to one end of data-writing, p-channel MOS transistor 65. The other end of data-reading MOS transistor 38 is coupled to the input terminal of sense amplifier circuit 40 and also to resistor 41 which in turn is coupled to power supply Vcc. Transistor 38 is turned on by a read-mode signal. The other end of data-writing MOS transistor 65 is coupled to high-voltage power supply Vpp. Transistor 65 is turned on by the output signal of buffer circuit 43 which is coupled to power supply Vpp. The input terminal of buffer circuit 43 is connected to the output terminal of NAND gate 66 for providing the logical sum of the write-mode signal and data $\overline{Din}$ to be written into the PROM. Buffer circuit 43 and NAND gate 66 constitute gate circuit 67 for writing data into the PROM.

The operation of the PROM shown in FIG. 9 will now be explained.

In order to read data from the PROM, the read-mode signal at level "1" is supplied to data-reading MOS transistor 38, and the write-mode signal at level "0" is supplied to one of the two input terminals of NAND gate 66. Hence, MOS transistor 38 is turned on, and data-writing MOS transistor 65 is turned off. In the read mode, one of outputs $A_l$ to $A_n$ of data-reading, column decoder (not shown) rises to level "1", thereby selecting one MOS transistor $63_j$ (j=1 to n) provided in first column-selecting circuit 61. The selected MOS transistor $63_j$ is turned on. Also, in the read mode, all outputs $\overline{B_1}$ to $\overline{B_n}$ of the data-writing, column decoder (not shown) are at level "1", and MOS transistors $64_1$ to $64_n$ of the second column-selecting circuit are turned off. Hence, the data read from memory cell $32_{ij}$ selected by row decoder 35 and the data-reading column decoder is supplied to sense amplifier circuit 40. Sense amplifier circuit 40 amplifies this data, and the amplified data, or output data Dout, is supplied from the output terminal of sense amplifier circuit 40.

On the other hand, in order to write data, the write-mode signal at level "1" is supplied to the first input terminal of NAND gate 66, and the read-mode signal at level "0" is supplied to data-reading MOS transistor 38. All outputs of the data-reading, column decoder are set at level "0". Therefore, MOS transistor 38 and all MOS transistors $63_1$ to $63_n$ of first column-selecting circuit 61 are turned off. When data $\overline{Din}$ is "1" in this condition, the output of NAND gate 66 falls to level "0", whereby data-writing MOS transistor 65 is turned on. A high voltage is thereby applied from high-voltage power source Vpp to column-signal line $34_j$ through MOS transistor 65 and then through column-selecting MOS transistor $64_j$ selected by the data-writing, column decoder. Data "0" is thus written into memory cell $32_{ij}$ connected to row-signal line $33_i$ selected by row decoder 35 and to column-signal line $34_j$ selected by the data-writing, column decoder. When data $\overline{Din}$ is "1" while the write-mode signal and the read-mode signal are at level "1" and level "0", respectively, the output of NAND gate 66 rises to level "1". In this case, data-writing MOS transistor 65 is turned off. Since data-reading MOS transistor 38 is also off at this time, no high voltage Vpp is applied to memory cell $32_{ij}$ selected by the data-writing, column decoder and row decoder 35. Hence, data "1" is written into memory cell $32_{ij}$.

FIG. 10 shows memory cell $32_{ij}$ and the circuit for writing data into this cell $32_{ij}$. In order to write data "0" into memory cell $32_{ij}$, a voltage at GND level i.e., level "0", is applied to the gate of data-writing MOS transistor 65, and also to the gate of column-selecting MOS transistor $64_j$ used for writing data. High voltage Vpp is applied to the back gates of MOS transistors 65 and $64_j$. Both transistors 65 and $64_j$ are of p-channel type, and their drain potentials Vc and Vd are not lowered by the threshold voltage and are thus equal to voltage Vpp applied to the source of transistor 65. Hence, high voltage Vpp is applied between the source and drain of memory cell $32_{ij}$, whereby a current great enough to write data "0" into cell $32_{ij}$ is obtained.

As has been described above, two column-selecting circuits are provided, that is, first column-selecting circuit 61 comprising n-channel MOS transistors $63_1$ to $63_n$ for reading data from memory cells $32_{11}$ to $32_{mn}$, and second column-selecting circuit 62 comprising p-channel MOS transistors $64_1$ to $64_n$ for writing data into memory cells $32_{11}$ to $32_{mn}$. Second column-selecting circuit 62 is used to apply voltage Vpp to the drains of memory cells $32_{11}$ to $32_{mn}$. First column-selecting circuit 61 is used to read GND-level or level "0" data since the sources of memory cells $32_{11}$ to $32_{mn}$, which are n-channel transistors, are at GND potential. MOS transistors $63_1$ to $63_n$ of first column-selecting circuit 61 must be of n-channel type in order to read GND-level data. Were they p-channel MOS transistors, their drain potential would not be at the GND level. Rather, their drain potential would be at a level higher than the GND level by $V_{THP}$, i.e., the threshold voltage of the p-channel MOS transistors.

Since two column-selecting circuits 61 and 62 are used, high voltage Vpp does not fall when data "0" is written into any memory cell. Hence, not only data "1" but also data "0" can be efficiently written into the memory cells, even if voltage Vpp is set at a relatively low level. Therefore, voltage Vpp is set at a low level, thus preventing a deterioration of the LSI in which the PROM is incorporated, and also preventing a latch-up phenomenon. For the same reason, the Vpp-generating circuit can be fabricated within the LSI, involving no particular technical difficulties.

Figure 11:
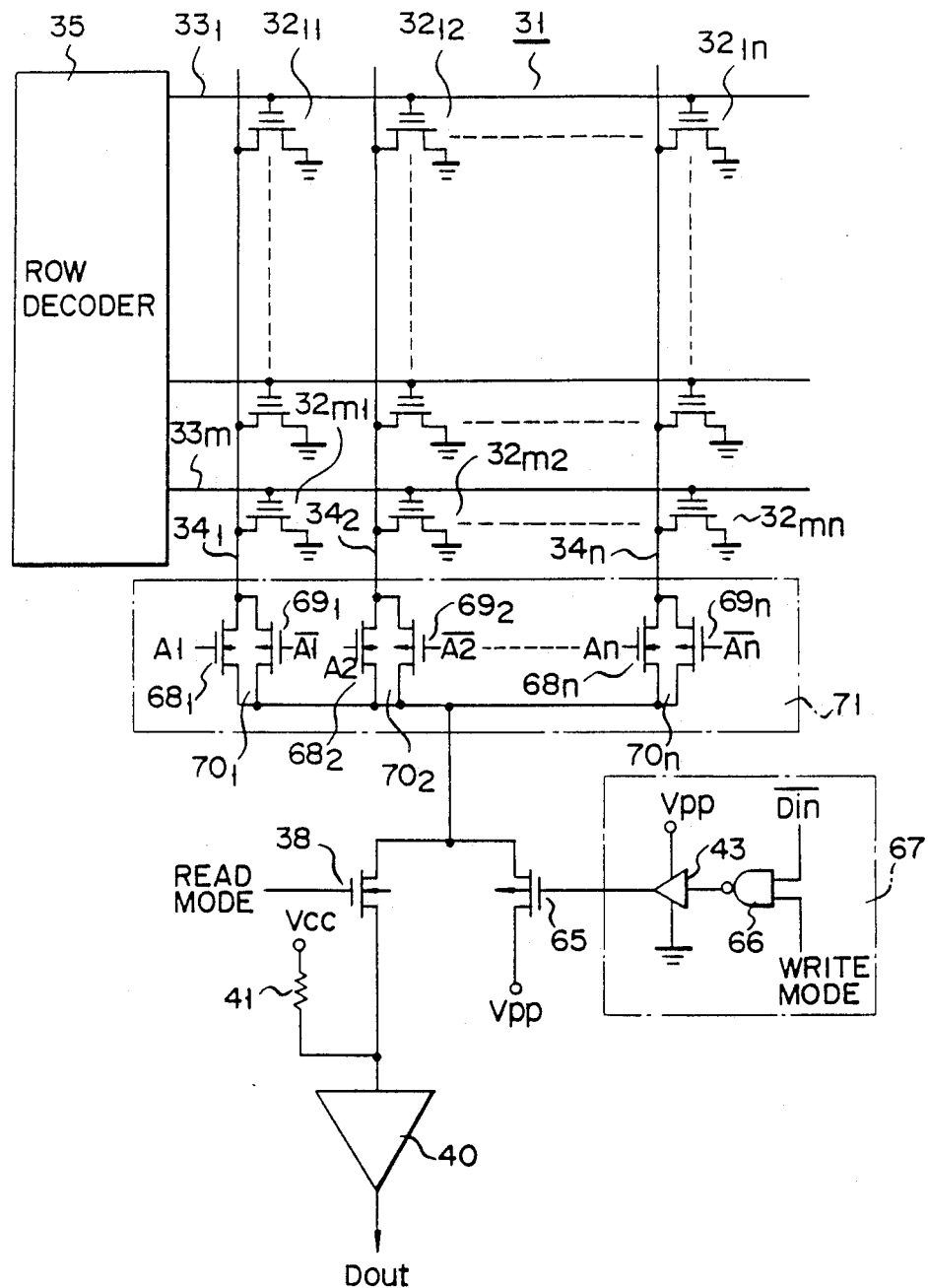
FIG. 11 is a circuit diagram of a semiconductor memory according to a third embodiment of the invention.

FIG. 11 shows a further PROM, according to a third embodiment of the present invention. In this figure, the same numerals and symbols are used to denote the same elements as used in the PROM shown in FIG. 9. This PROM differs from the PROM of FIG. 9 in that one column-selecting circuit 71 is used in place of two circuits 61 and 62. This column-selecting circuit 71 comprises complementary transmission gates $70_1$ to $70_n$, each consisting of one n-channel MOS transistors and one p-channel MOS transistor. More specifically, as is shown in FIG. 11, first gate $70_1$ consists of n-channel MOS transistor $68_1$ and p-channel MOS transistor $69_1$, second gate $70_2$ consists of n-channel MOS transistors $68_2$ and p-channel MOS transistor $69_2$, and so forth. And the last gate $70_n$ consists of n-channel MOS transistor $68_n$ and p-channel MOS transistor $69_n$. In each transmission gate, the n-channel and p-channel MOS transistors are connected in parallel to each other.

The n-channel MOS transistors $68_l$ to $68_n$ of transmission gates $70_l$ to $70_n$ are turned on by decode signals $A_l$ to $A_n$ output from a column decoder (not shown), thereby to read data from memory cells $32_{11}$ to $32_{mn}$. On the other hand, the p-channel MOS transistors $69_1$ to $69_n$ of transmission gates $70_1$ to $70_n$ are turned on by decode signals $\overline{A_1}$ to $\overline{A_n}$ output from the decoder (not shown) whose level is inverted to that of signals $A_l$ to $A_n$, thereby to write data into memory cells $32_{11}$ to $32_{mn}$. That is, the transmission gates can function in both a data-read mode and a data-write mode, in accordance with decode signals $\overline{A_l}$ to $\overline{A_n}$ output from the column decoder (not shown) and decode signals $A_l$ to $A_n$ obtained by inverting decode signals $\overline{A_l}$ to $\overline{A_n}$.

In the PROM shown in FIG. 11, the GND-level data is output through the n-channel MOS transistor of a transmission gate, and the Vpp-level data is input through the p-channel MOS transistor of the transmission gate. Therefore, high voltage Vpp does not fall by the threshold voltage $V_{THN}$ of the n-channel MOS transistor when data "0" is written into the selected memory cell. Neither does the GND-level voltage rise by the threshold voltage $V_{THP}$ of the p-channel MOS transistor when data "0" is read from the selected memory cell.

Unlike the PROM shown in FIG. 9, the PROM of FIG. 11 has only one column-selecting circuit, i.e., circuit 71. It follows that this PROM needs to have only one column decoder. Decode signals $\overline{A_i}$ to $\overline{A_n}$, and $A_1$ to $A_n$ are used to control transmission gates $70_1$ to $70_n$. Hence, the PROM of FIG. 11 does not require so large a pattern area as the PROM shown in FIG. 9.

Figure 12:
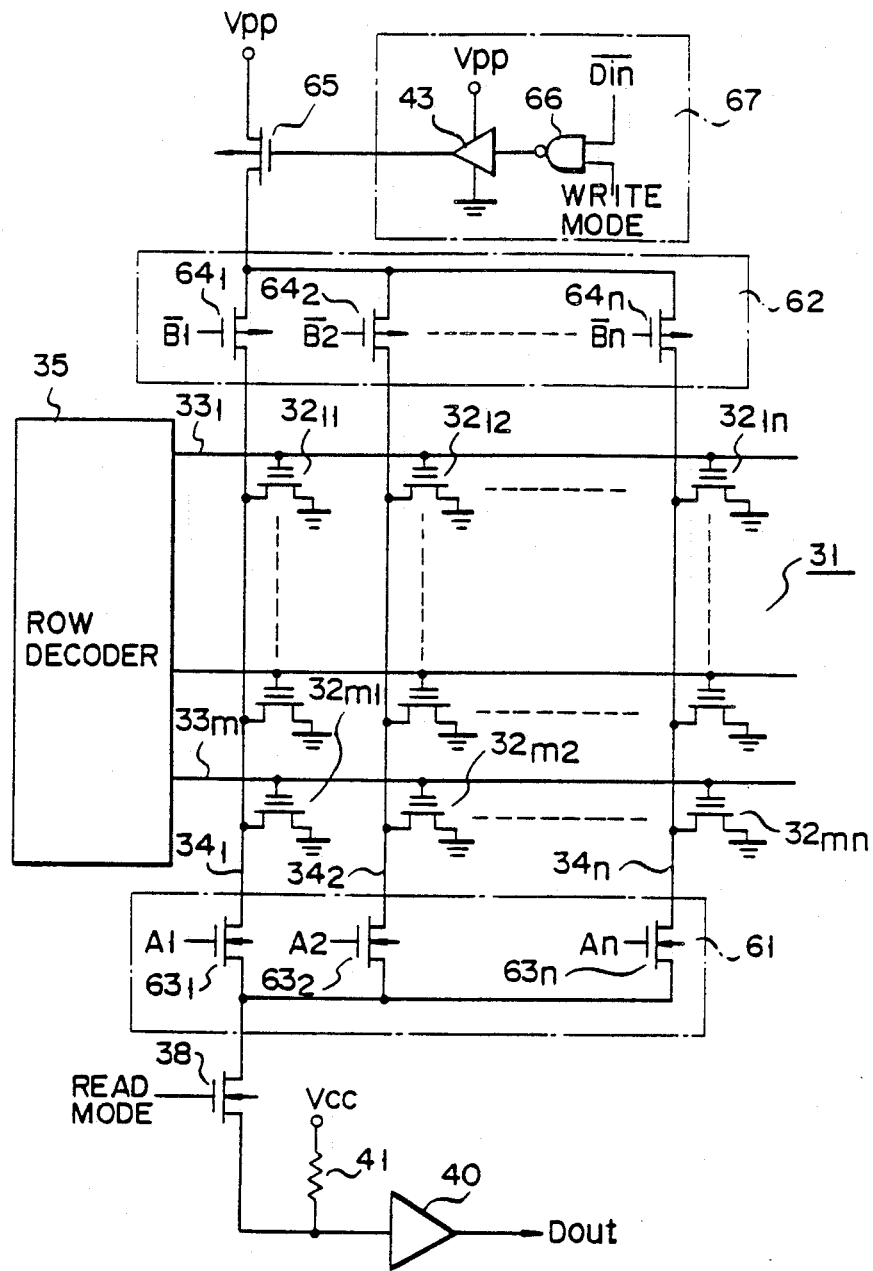
FIG. 12 is a circuit diagram of a semiconductor memory according to a fourth embodiment of the invention.

FIG. 12 illustrates still another PROM, according to a fourth embodiment of the present invention. In this figure, too, the same numerals and symbols are used to represent the same elements as used in the PROM shown in FIG. 9. This PROM differs from that of FIG. 9 in that first column-selecting circuit 61 for reading data is provided on one side of memory-cell array 31, whereas second column-selecting circuit 62 for writing data is provided on the other side of array 31. This specific arrangement reduces the required area on the semiconductor chip. Column-signal lines $34_1$ to $34_n$ are arranged parallel at extremely short intervals, thereby raising the integration density of the PROM. Were column-selecting circuits 61 and 62 both provided on one and the same side of memory-cell array 31, the output lines of the column decoders (not shown) would of necessity be connected on this side of array 31, not only to n-channel MOS transistors $63_1$ to $63_n$, but also to p-channel MOS transistors $64_1$ to $64_n$. Forming as many nodes as all these MOS transistors would require a pattern area larger than that needed in the PROM of FIG. 12 in which column-selecting circuits 61 and 62 are provided on the opposite sides of cell array 31. Moreover, this specific arrangement of column-selecting circuits 61 and 62 ensures complete electrical isolation between n-channel MOS transistors $63_1$ to $63_n$, on the one hand, and p-channel MOS transistors $64_1$ to $64_n$, on the other. That is, if n-channel MOS transistors $63_1$ to $63_n$ were arranged near p-channel MOS transistors $64_1$ to $64_n$ as in the PROM shown in FIG. 9, a latch-up phenomenon would likely occur. This undesired phenomenon should be avoided at all cost, because, in writing data in the PROM, a large current of tens of milliamperes flows through data-writing MOS transistors $64_1$ to $64_n$.

As has been described above, in the semiconductor memories according to the embodiments of FIGS. 9–12, data "0" can be written into each memory cell at a sufficiently high speed, even if the data-writing voltage is relatively low.

Figure 13:
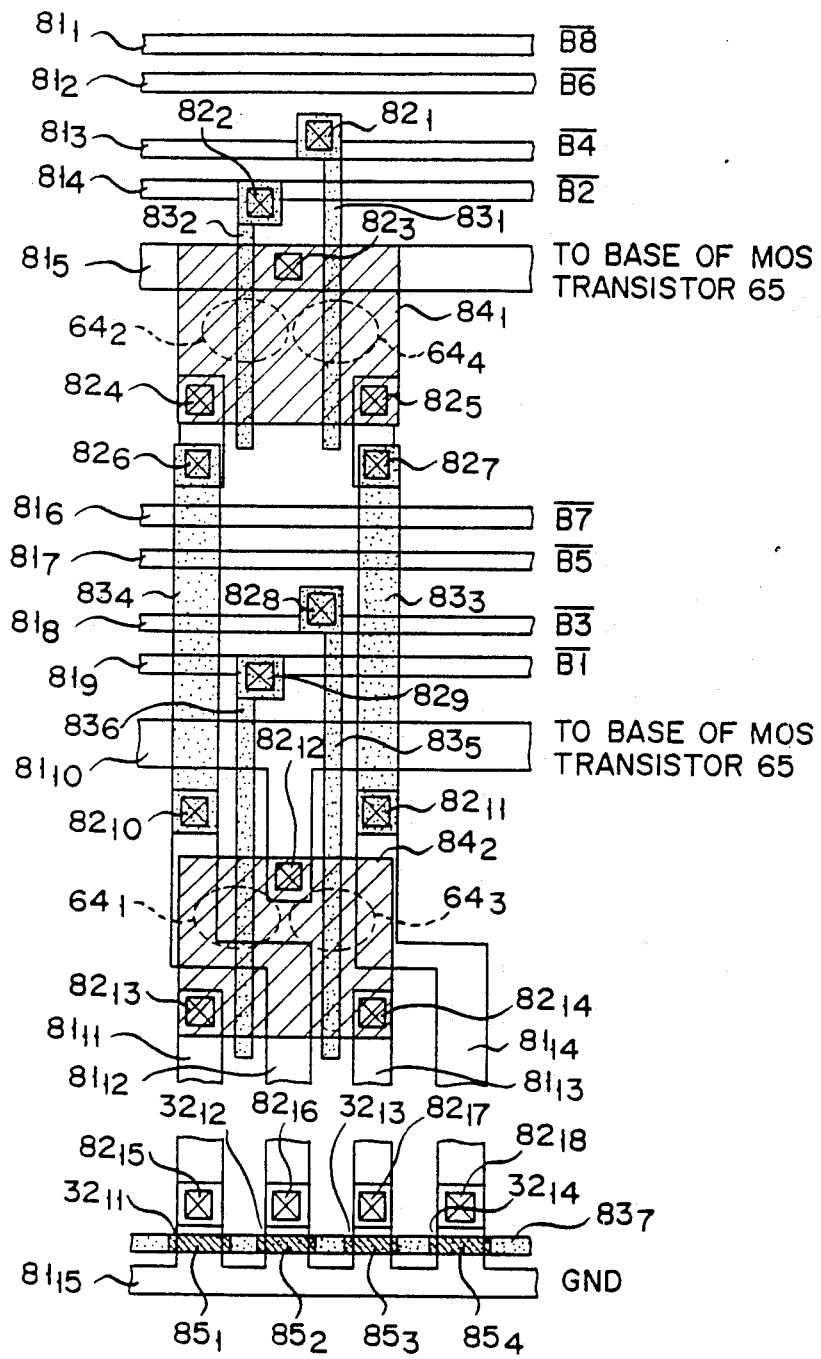
FIG. 13 is a diagram showing the pattern in which the elements of the column-selecting circuit used in the memory of FIG. 12 are arranged.

FIG. 13 shows the pattern in which the elements of column-selecting circuit 62 for writing data are arranged in the PROM illustrated in FIG. 12. In this figure, the same numerals and symbols are used to designate the same elements as shown in FIG. 12. As is shown in FIG. 13, aluminum strips $81_1$ to $81_{15}$ are arranged parallel to one another. Contacts holes $82_1$ to $82_{18}$ are provided to connect some elements to others. Polycrystalline silicon layers $83_1$ to $83_7$ and diffusion layers $84_1$ and $84_2$ are also provided. Numerals $85_1$ to $85_4$ denote the floating gates of memory cells $32_1$ to $32_4$. MOS transistors $64_1$ to $64_4$ are formed in the hatched regions.

As has been described above, the present invention can provide a semiconductor memory wherein, even if the memory cells have different operation points arising from differences in their respective process parameters, the data-writing characteristic of each memory cell can be sufficiently stable, thereby ensuring that data can be written into each cell at high speed, and which can, therefore, be manufactured with a high yield.

Furthermore, the present invention can provide a semiconductor memory wherein data "0" can be written into each memory cell at a sufficiently high speed, even if the data-writing voltage is relatively low.

What is claimed is:

1. A semiconductor memory device comprising:
   a cell matrix comprising a plurality of floating gate, MOS transistors arranged in rows and columns, and used as memory cells;
   a plurality of row lines equal in number to the rows of memory cells, one row line being connected to the gate of each of the memory cells of the corresponding row;
   a plurality of column lines equal in number to the columns of memory cells, one column line being connected to the drain of each of the memory cells of the corresponding column;
   a data-writing, column-selecting circuit including a plurality of p-channel MOS transistors connected at one end to said column lines, respectively, and controlled by data-writing, column-decode signals;
   a data-reading, column-selecting circuit including a plurality of n-channel MOS transistors connected at one end to said column lines, respectively, and controlled by data-reading, column-decode signals; and
   a data-writing, p-channel MOS transistor connected to the other ends of the p-channel MOS transistors of said data-writing, column-selecting circuit, for applying a high voltage to those memory cells selected and turned on when the semiconductor memory is set in level "0" data-writing mode.

2. A semiconductor memory device according to claim 1, wherein the p-channel MOS transistors of said data-writing column-selecting circuit are connected in parallel to the n-channel MOS transistors of said data-reading, column-selecting circuit, respectively, thereby forming transmission gates.

3. A semiconductor memory device according to claim 1, wherein said data-writing, column-selecting circuit and said data-reading, column-selecting circuit are located at opposite sides of said cell matrix comprising said floating gate MOS transistors.

4. A semiconductor memory device comprising:
   a cell matrix comprising a plurality of floating gate, MOS transistors of a first conductivity type arranged in rows and columns, and used as memory cells;
   a plurality of row lines equal in number to the rows of memory cells, one row line being connected to the gate of each of the memory cells of the corresponding row;
   a plurality of column lines equal in number to the columns of memory cells, one column line being connected to the drain of each of the memory cells of the corresponding column;
   a data-writing, column-selecting circuit including a plurality of MOS transistors of a second conductivity type connected at one end to said column lines, respectively, and controlled by data-writing, column-decode signals;
   a data-reading, column-selecting circuit including a plurality of MOS transistors of said first conductivity type connected at one end to said column lines, respectively, and controlled by data-reading, column-decode signals; and
   a data-writing, MOS transistor of said second conductivity type connected to the other ends of the MOS transistors of said second conductivity type of said data-writing, column-selecting circuit, for applying a high voltage to those memory cells selected and turned on when the semiconductor memory is set in a level "0" data-writing mode.

5. A semiconductor memory device according to claim 4, wherein the MOS transistors of said second conductivity type of said data-writing, column-selecting circuit are connected in parallel to the MOS transistors of said first conductivity type of said data-reading, column selecting circuit, respectively, thereby forming transmission gates.

6. A semiconductor memory device according to claim 4, wherein said data-writing, column-selecting circuit and said data-reading, column-selecting circuit are located at opposite sides of said cell matrix comprising said floating gate, MOS transistors of said first conductivity type.

* * * * *